United States Patent
Maehara et al.

(10) Patent No.: US 7,354,288 B2
(45) Date of Patent: Apr. 8, 2008

(54) SUBSTRATE SUPPORT WITH CLAMPING ELECTRICAL CONNECTOR

(75) Inventors: Kazutoshi Maehara, Chiba-ken (JP); Visweswaren Sivaramakrishnan, Cupertino, CA (US); Kentaro Wada, Chiba-ken (JP); Mark A. Fodor, Redwood City, CA (US); Andrzei Kaszuba, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 165 days.

(21) Appl. No.: 11/145,258

(22) Filed: Jun. 3, 2005

(65) Prior Publication Data

US 2006/0272774 A1    Dec. 7, 2006

(51) Int. Cl.
*H01R 4/60* (2006.01)

(52) U.S. Cl. ........................... 439/193; 118/728

(58) Field of Classification Search ................ 439/801, 439/800; 118/728
See application file for complete search history.

(56) References Cited

U.S. PATENT DOCUMENTS

| | | | | |
|---|---|---|---|---|
| 2,231,916 | A * | 2/1941 | Jackson | 439/801 |
| 2,357,858 | A * | 9/1944 | Trees et al. | 439/485 |
| 4,500,157 | A * | 2/1985 | Huffnagle et al. | 439/391 |
| 6,445,567 | B1 * | 9/2002 | Komatsuki et al. | 361/518 |
| 6,475,606 | B2 * | 11/2002 | Niwa | 428/210 |
| 6,689,930 | B1 * | 2/2004 | Pang et al. | 134/1.1 |
| 2006/0164786 | A1 * | 7/2006 | Kobayashi et al. | 361/234 |

* cited by examiner

*Primary Examiner*—James Harvey
*Assistant Examiner*—Travis Chambers
(74) *Attorney, Agent, or Firm*—Janah & Associates

(57) ABSTRACT

A substrate support comprises a ceramic disc with an electrode that is chargeable through an electrode terminal. An electrical connector connects an external power source to the electrode terminal. The electrical connector has a pair of opposing pincer arms, a groove sized to fit around the electrode terminal, and a pair of through holes to receive a tightening assembly capable of tightening the opposing pincer arms about the electrode terminal.

23 Claims, 5 Drawing Sheets

SUBSTRATE SUPPORT WITH CLAMPING ELECTRICAL CONNECTOR

BACKGROUND

Embodiments of the present invention relate to a substrate support for holding a substrate in a substrate processing chamber.

In the fabrication of electronic circuits and displays, semiconductor, dielectric, and electrically conducting materials are formed on a substrate, such as a silicon wafer or glass. The materials can be formed by chemical vapor deposition (CVD), physical vapor deposition (PVD), ion implantation, oxidation and nitridation processes. Thereafter, the deposited materials can be etched to form features such as gates, vias, contact holes and interconnect lines. In a typical process, the substrate is exposed to a plasma in a substrate processing chamber to deposit or etch material on the substrate. The plasma can be formed by inductively or capacitively coupling energy to a process gas or by passing microwaves through the process gas.

During processing, the substrate is held on a substrate support having a substrate receiving surface. The support can have an embedded electrode that serves as part of the gas energizer and which may also be charged to electrostatically hold the substrate. The support can also have a resistance heater to heat the substrate during processing, and/or a water cooling system to cool the substrate or to cool the support. Thus, the support typically has a plurality of electrical connector and other conducting structures that extend through a hollow shaft to power the resistance heater, electrode, and other devices. Thermocouples can also be provided to allow more accurate measurement of substrate temperatures. The electrical connector also typically need to allow thermal expansion movement of the connecting structures, such as connecting rods, that arises from heating of the components during substrate processing.

One problem that arises with the electrical connector in the support, especially a connector that provides electrical power to or electrically grounds the electrode, occurs when the current passing through the connector results in electrical arcing or glow discharges within the shaft of the support. For example, electrical arcing can occur between a RF connector that is used to ground the electrode and the walls of a surrounding shaft. The arcing results when the electrical connector, which is press fitted onto a power supplying rod, looses its tightness over time causing arcs to occur in the gap between the connector and shaft sidewalls. Such arcing is undesirable because it damages and oxidizes the contact points between the connector and shaft wall, which further increases the electrical resistance of the contact points, eventually resulting in severe erosion and even melting at contact points. Eventually, the connector or its surrounding regions burn out and processing of the substrate is abruptly terminated causing loss of the entire substrate being processed.

Thus, it is desirable to have an electrical connector for a substrate support that reduces electrical arcing in a plasma environment. It is also desirable to have an electrical connector that reliably allows RF current passage for a large number of process cycles without requiring replacement or repair. It is also desirable to have an electrical connector that allows thermal expansion movement of the connector structures without losing electrical contact. It is further desirable to have an electrical connector that can be easily removed and replaced.

SUMMARY

A substrate support comprises a ceramic disc having a surface to receive a substrate. An electrode is embedded in the ceramic disc, and an electrode terminal has a first end electrically coupled to the electrode and a second end extending out of the ceramic disc. An electrical connector is provided for connecting an external power source to the electrode terminal, the electrical connector comprises a pair of opposing pincer arms, a groove sized to fit around the second end of the electrode terminal, and a pair of through holes for receiving a tightening assembly capable of tightening the pincer arms about the electrode terminal.

The ceramic disc can also have an embedded resistance heater with a pair of heater terminals that each have a first end connected to the resistance heater and a second end extending out of the ceramic disc. In this version, a pair of second electrical connector are provided for connecting an external power source to the resistance heater, the second electrical connector each comprising a pair of opposing pincer arms, a groove sized to fit around a second end of a heater terminal, and a pair of through holes for receiving a tightening assembly capable of tightening the pincer arms about the heater terminal.

A substrate processing apparatus that uses the substrate support, includes a process chamber comprising enclosing walls, the substrate support, a gas distributor, a gas exhaust, and a gas energizer. An external power source provides electrical power to the electrode. A controller comprises program code to provide instructions to the external power source to provide a selected power level to the electrode.

A method of using the electrical connector includes the steps of sliding the electrical connector onto the electrode terminal so that the terminal rests in the groove of the electrical connector, inserting a tightening assembly into the through holes of the electrical connector; and tightening the tightening assembly so that the opposing pincer arms of the electrical connector squeeze the electrical terminal.

The substrate support can be refurbished by releasing the tightening assembly and withdrawing the electrical connector from the electrode terminal. At least one of the electrode terminal and electrical connector is cleaned or replaced. A cleaned or replaced electrical connector is then slid back onto a cleaned or replaced electrode terminal so that the terminal rests in the groove of the electrical connector. A tightening assembly is inserted into the through holes of the electrical connector, and tightened so that the pincer arms are squeezed onto the electrode terminal.

DRAWINGS

These features, aspects, and advantages of the present invention will become better understood with regard to the following description, appended claims, and accompanying drawings which illustrate exemplary features of the invention:

DESCRIPTION

Figure 1:
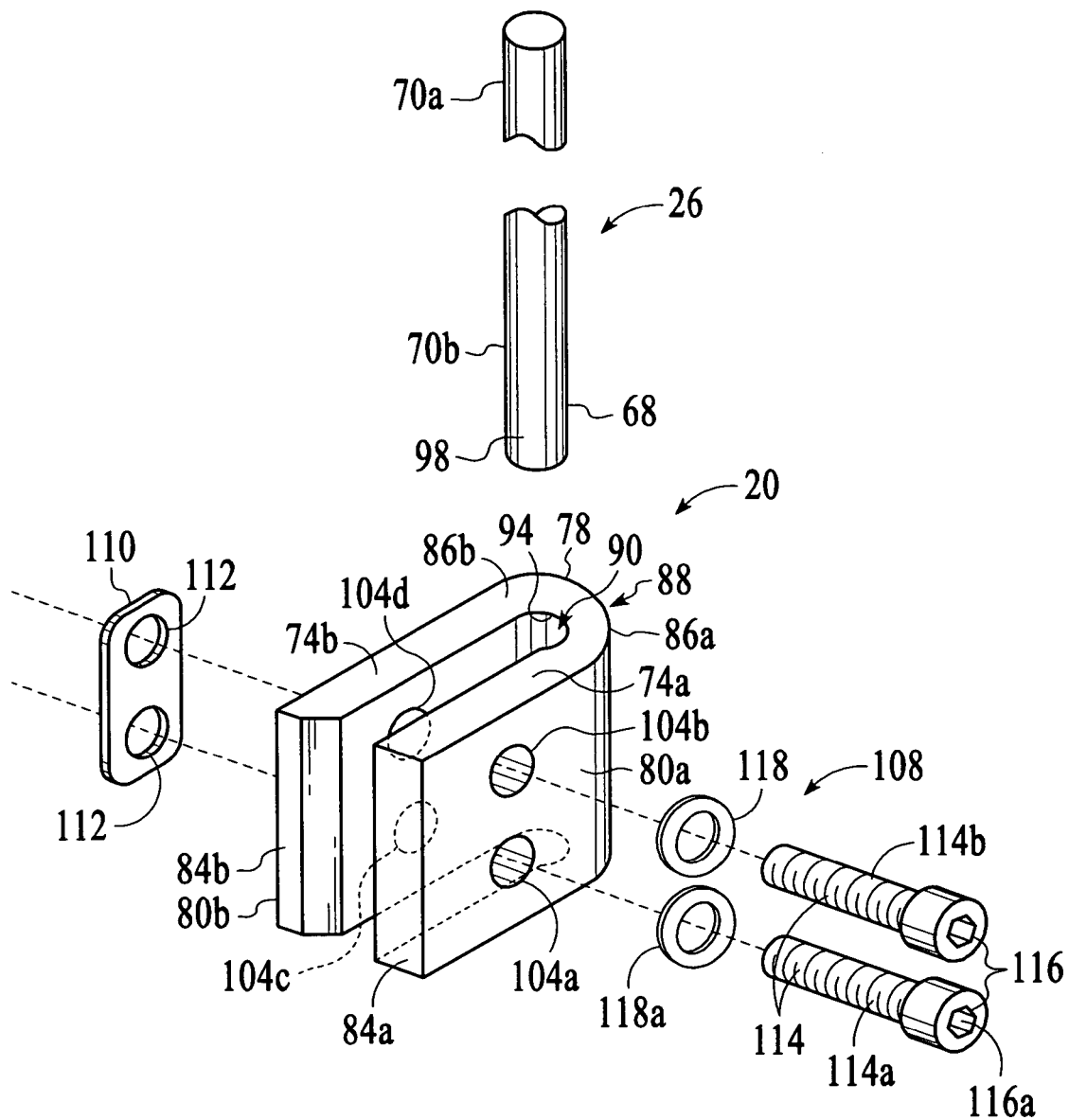
FIG. 1 is an exploded perspective view of an embodiment of an electrical connector in an open mode.
Figure 5:
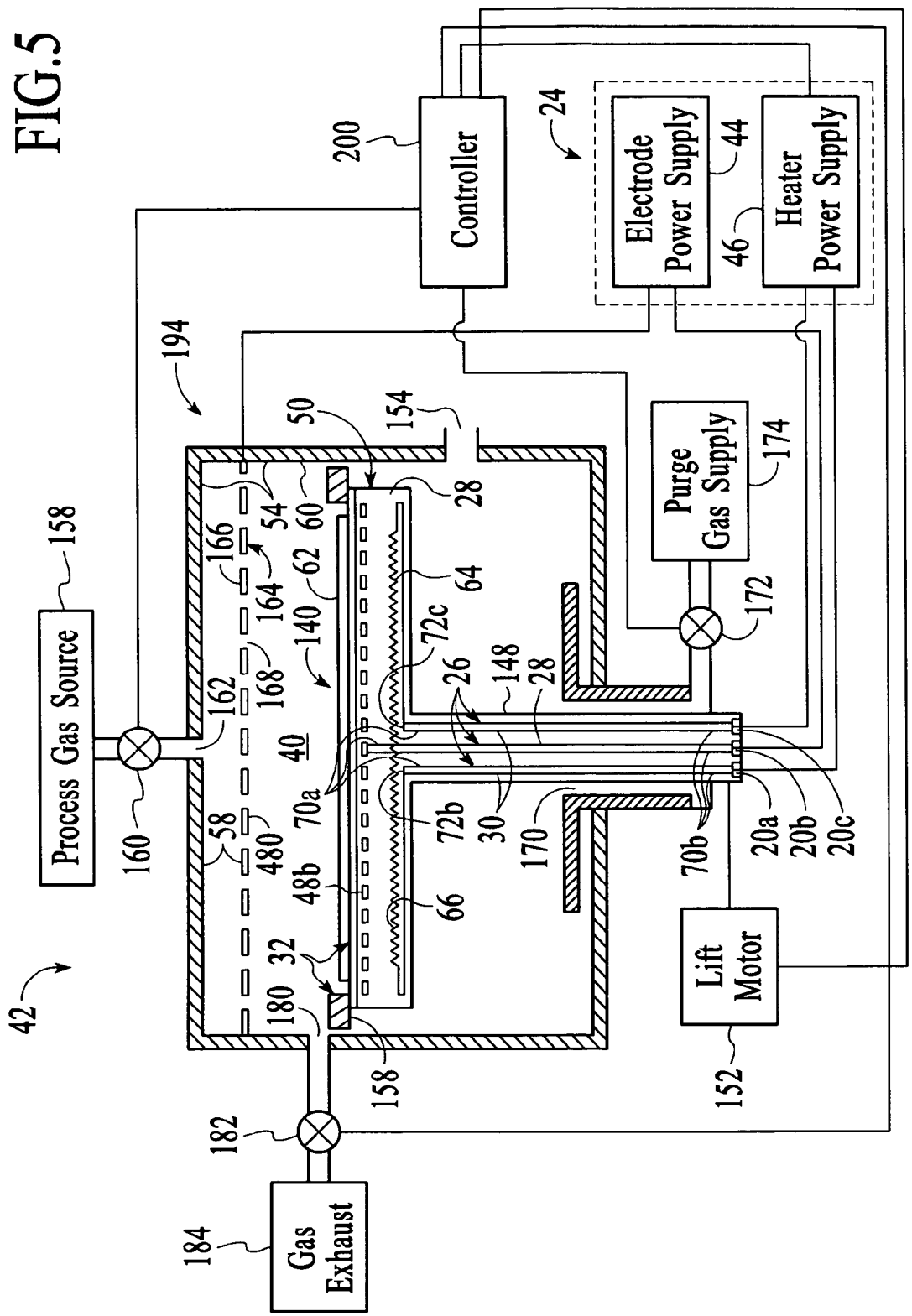
FIG. 5 is a schematic sectional side view of an embodiment of a substrate processing chamber comprising the substrate support and electrical connector of FIG. 4.

An embodiment of an electrical connector 20 according to the present invention, as illustrated in FIG. 1, is useful for connecting an external power source 24 to a terminal 28 of a chamber component 32 in a process zone 40 in a substrate processing chamber 42—an embodiment of which is shown in FIG. 5. The external power source 24 provides electrical power to operate the components of the chamber 42, and can include, for example, an electrode power supply 44, heater power supply 46, and other power supplies to operate other components 32 of the chamber 42. The chamber component 32 can be, for example, electrodes, inductor coils, resistance heaters and lamps. Typically, the electrical connector 20 is used to ground or supply a high voltage to the terminal 28 of the component 32 that may result in exposure of the component to arcing, glow discharges and other plasma exposure that would otherwise erode or degrade the component. The electrical connector 20 is particularly useful to reduce or prevent erosion or corrosion of the electrical contact between the connector 20 and the terminal 28 to maintain electrical contact with the component 32.

In one version, the electrical connector 20 is used to connect an external power source 24 comprising an electrode power supply 44 that provides electrical power in the form of an alternating or direct current to the terminal 28 of an electrode 48 in the chamber. For example, the electrode power supply 44 can apply a radio frequency voltage between first and second electrodes 48a,b in the chamber to generate a plasma from a process gas in the chamber 42. The first electrode 48a can be formed by an enclosure wall 54 such as a ceiling 58 or side wall 60 of the chamber 42, which is made of an electrically conducting material, such as a metal for example, aluminum; and is spaced apart from a second electrode 48b in a substrate support 50 which is electrically grounded or floated. The first and second electrodes 48a,b capacitively couple the applied RF energy to the process gas to form or sustain the plasma. In addition, the electrode power supply 44 can also provide a direct current voltage to the second electrode 48b to allow it to serve as an electrostatic attraction member that electrostatically holds a substrate 62 on the substrate support 50. The electrode power supply 44 provides the voltages via an electrode terminal 28 that is electrically connected to one or both of the electrodes 48a,b.

In another application, the external power source 24 can also include a heater power supply 46 which is used to provide a controllable voltage to a pair of heater terminals 30a,b of a resistance heater 64 in the substrate support 50. For example, the resistance heater 64 can be an electrical resistance element 66 in the substrate support 50. In another version, the resistance heater 64 can be a series of radiant lamps, which are around or above the substrate support. The heater power supply 46 can provide a direct current voltage across the two terminals 30a,b of the resistance heater 64 with each terminal providing a separate polarity of the voltage. In this version, two different electrode connectors 20a,b are used, with each connector 20 connected to a single terminal 30a,b respectively, of the resistance heater 64, as shown in FIG. 5.

In one version, the terminal 26 is shaped as a long rod 68 that extends out from one or both of the electrodes 48 or resistance heater 64 of the substrate support 50. Each terminal rod 68 has two ends, a first end 70a which is connected directly to an electrode 48 or resistance heater 64, or which may be press fitted against a contact junction 72 which in turn is electrically connected to the electrode 48 or resistance heater 64; and a second end 70b which is connected to the electrical connector 20. The elongated rod 68 extends out of the process zone 40 of the chamber 42 to allow an electrical connection to be made at a point distal to the electrode 48 or resistance heater 64. The extended terminal rod 68 reduces the likelihood of erosion of the terminal 26 in the process gas environment of the process zone 40 in the chamber 42. A suitable rod 68 comprises a diameter of from about 2 to about 10 mm, and a length of from about 10 to about 500 cm.

Figure 2A:
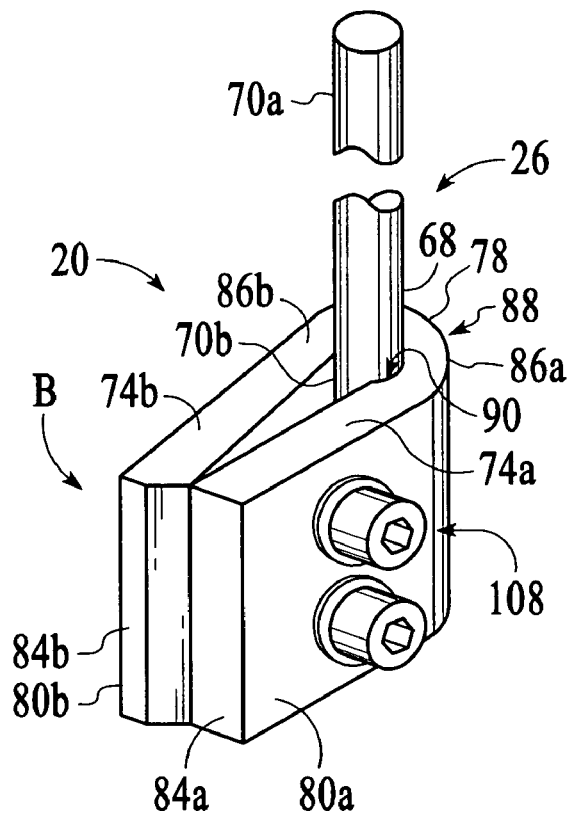
FIG. 2A is a perspective view of the electrical connector of FIG. 1 in an closed mode and from the right side.
Figure 2B:
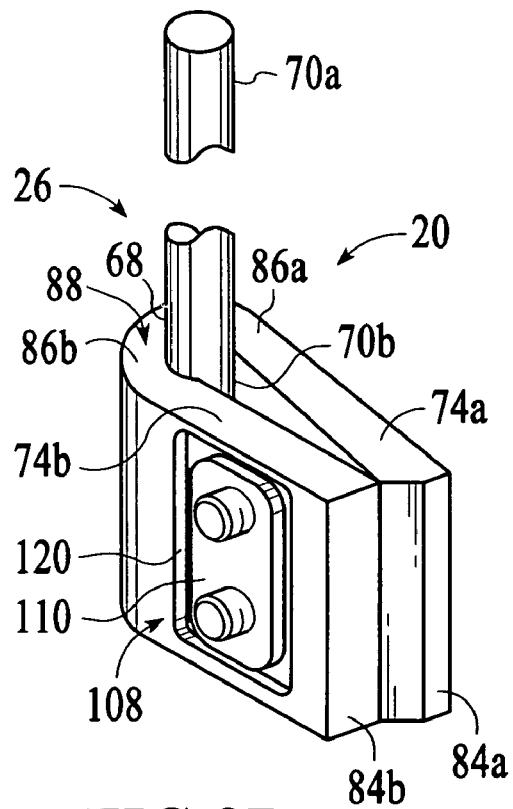
FIG. 2B is a perspective view of the electrical connector of FIG. 2A from the left side.

The electrical connector 20 comprises a pair of, for example first and second, opposing pincer arms 74a,b that are joined together at one of their ends by a curved coupling span 78, an exemplary version of which is shown in FIGS. 1, 2A and 2B. The pincer arms 74a,b comprise opposing first and second plates 80a,b having first ends 84a,b, respectively, which extend outwardly from the curved coupling span 78 defined by their second ends 86a,b. The curved coupling span 78 can be a C-shaped member 88 that is integral to the opposing pincer arms 74a,b. The integral C-shaped member 88 can be fabricated from the same unitary metal strip as the first and second plates 80a,b to form a continuous structure. The C-shaped member 88 joins the pincer arms 74a,b to one another at their second ends 86a,b. The pincer arms 74a,b are electrical conductors and can be made, from example, from a metal, such as copper, steel or aluminum, and can also be plated with a non-reactive metal such as gold to further increase its erosion resistance. The pincer arms 74a,b can be fabricated, by for example, drop forging, casting, or injection molding; and the holes and other features of the arms, such as the chamfered edges, made by drilling or chamfering.

In one version, the first pincer arm 74a comprises a first plate 80a having a uniform thickness while the second pincer arm 74b comprises a second plate 80b that is tapered as shown in FIGS. 2A and 2B. The second plate 80b is tapered by an amount such that the tapered second plate 80b can bend toward the first straight plate 80a under an applied force. Typically, the taper angle is from about 5 to about 15 degrees.

The electrical connector 20 has a groove 90 sized to fit around the terminal 26 that is shaped to have an internal contour 94 corresponding to the external contour 98 of the terminal 26. The groove 90 can be a recessed groove in the pincer arms 74a,b or the C-shaped member 88, and is sized with a radius that allows the connector 20 to extend around and encircle a terminal 26. The groove 90 can be tapered from the bottom to the top of the connector 20 to more secure connection between the electrical connector 20 and the terminal 26. The longitudinal axis of the groove 90 is oriented along the length of the groove, along the direction of insertion of the terminal 26, and between the top and bottom of the connector 20. The groove 90 is sized so that when the pincer arms 74a,b are squeezed towards one another by a compressive force, the groove 90 compression fits and securely holds the terminal 26.

Through holes 104a-d which are aligned to one another pass through the unattached end of the pincer arms 74a,b. The through holes 104a-d comprise a first set of through holes 104a,b and a second set of through holes 104c,d. The first set of through holes 104a,b pass through the first pincher arm 74a and the second set of through holes 104c,d pass through the second pincher arm 74b. Each set of through holes 104a,b, 104c,d comprises a pair of holes which are aligned to one another, and each set of holes 104a,b or 104c,d is located along an axis that is substantially parallel to the longitudinal axis of the groove 90 in the electrical connector 20. The though holes 104a-d receive a tightening assembly 108 that is capable of tightening the pincer arms 74a,b about the terminal 26. In one version, a screw plate 110 has threaded screw holes 112, and tightening assembly 108 comprises a pair of screws 114a,b which thread into the screw holes 112 of the screw plate 110. Each screw 114a,b also has a hexagonal hole 162a,b for a hex wrench arm to turn the screw, and a washer 118a,b can also be used. The screw plate 110 can also rest inside a matching recess 120 in one of the pincer arms 74a,b, as shown in FIG. 2B. For example, both the recess 120 and the screw plate 110 can be rectangular with rounded corners.

The tightening assembly 108 can also be formed by other tightening means. For example, in another version, at least one of the through holes 104a-d comprises a screw thread (not shown) and the tightening assembly 108 comprises a screw sized to turn into the screw thread to gradually tighten the pincer arms 74a,b against each other. In yet another version, also not shown, the tightening assembly 108 can comprise a pair of matching nuts and bolts (also not shown) that extend through un-threaded holes 104a-d in the pincer arms 74a,b.

In use, an electrical connector 20 is slid over a terminal 26 until the terminal rests in the groove 90 of the electrical connector 20. The tightening assembly 108 is then assembled and tightened so that that the second pincer arm 74b comprising the tapered second plate 80b bends toward the first pincher arm 74a comprising the straight first plate 80a when the tightening assembly 108 is tightened.

Figure 4:
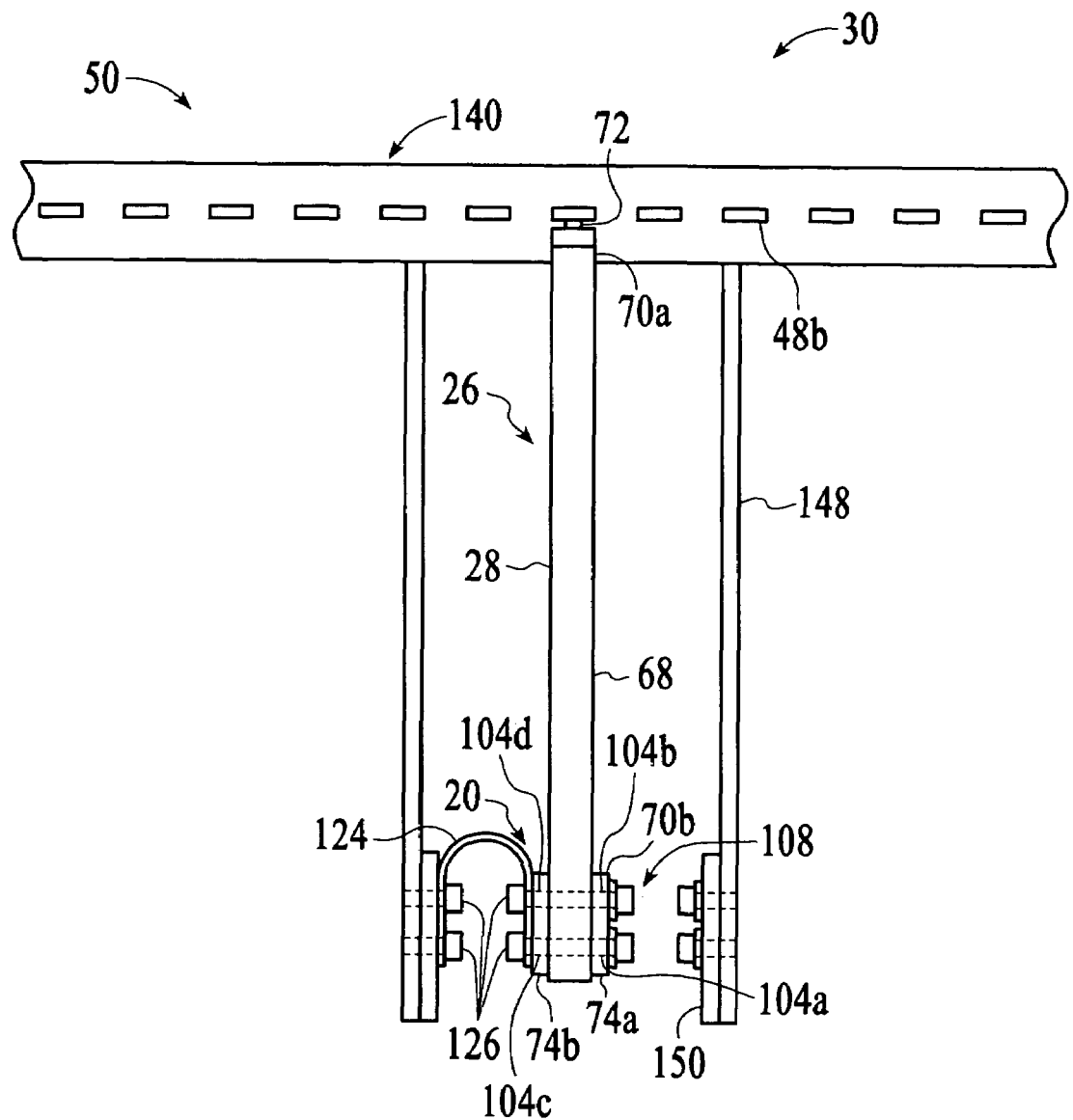
FIG. 4 is a perspective view of an embodiment of a support showing the electrical connector connected to an electrode terminal.

Referring to FIG. 4, an external power source 24 is connected by a flexible wire strap 124 to the electrical connector 20 for grounding, or passing a voltage or current through the connector 20, to the terminal 26. The flexible wire strap 124 can be attached to the pincer arms 74a,b connector 20 by the tightening assembly 108 so that the tightening assembly itself couples the wire strap 124 to the electrical connector 20. In this version, the wire strap 124 has a pair of strap holes 126 that are spaced apart by the same distance as the through holes 104a,b in the pincer arm 74a to allow the screws or nuts of the tightening assembly 108 to pass through. The tightening assembly 108 thus serves as a single structure that securely contacts the wire strap 124 against the pincer arms 74a,b, and also clamps the pincer arms 74a,b to the terminal 26. The wire strap 124 can be made from braided copper wire that is plated with gold to reduce erosion.

Figure 3A:
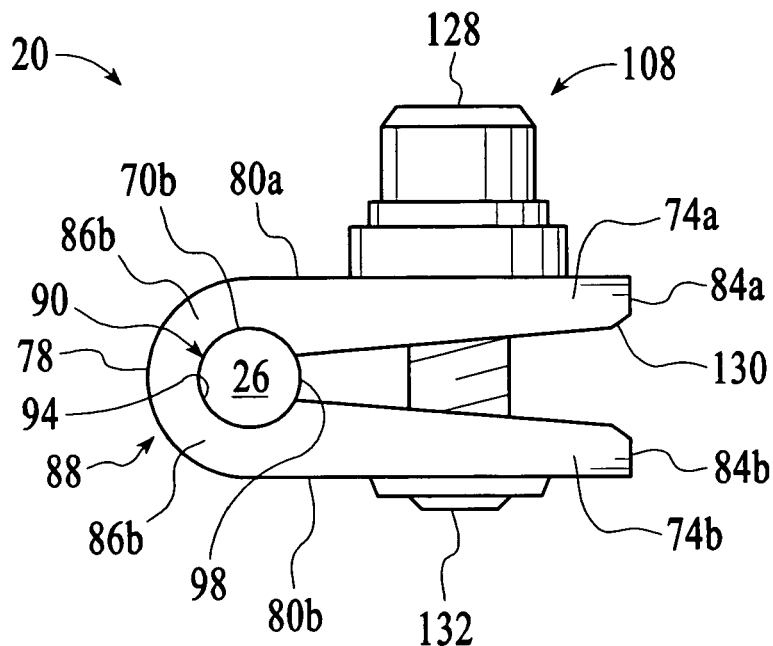
FIG. 3A is a side view of another embodiment of an electrical connector in an open mode.
Figure 3B:
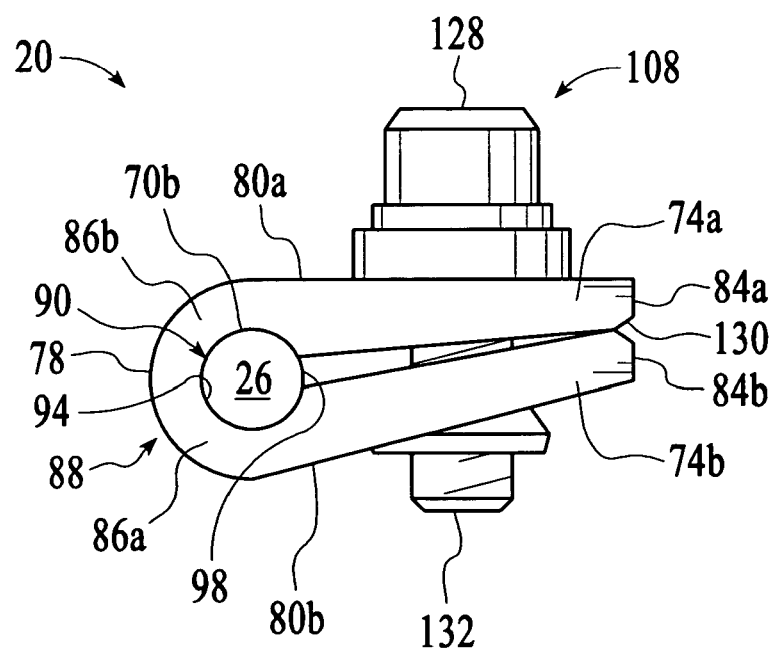
FIG. 3B is a side view of the electrical connector of FIG. 3A in a closed mode.

In another version, as shown in FIGS. 3A and 3B, the first and second pincer arms 74a,b are both tapered so that when the tightening assembly 108 is tightened, both pincer arms 74a,b move towards one another. The pincer arms 74a,b comprise opposing first and second plates 80a,b which are both tapered at their first ends 84a,b. The second ends 86a,b of the arms 74a,b extend outwardly from the curved coupling span 78 which is a C-shaped member 88 having an internal contour 94 matching the external contour 98 of the terminal 26 to form the groove 90. The integral C-shaped member 88 can also be fabricated from the same unitary metal strip as the first and second plates 80a,b. A liner 130 of a softer material, such as a more ductile conducting metal, for example, a nickel alloy, covers the internal surfaces of both pincer arms 74a,b as well as the groove 90 to better grip the terminal 26. Also, in this version, the tightening assembly 108 comprises a threaded nut 128 and bolt 132 to tighten and force the pincer arms 74a,b against one another.

The electrical connector 20 provides a secure electrical connection that is capable of reducing glow discharges or arcing about the connector 20 or terminal 26 because the extended length of the terminal rod 68 positions the entire assembly far away from the process zone 40 in which the plasma is formed. Furthermore, the terminal rod 68, connector 20 and flexile wire strap 124 being connected to one another, but not attached to the hollow shaft 148, can freely thermally expand in both the radial and longitudinal directions without stressing the electrode 48b in the ceramic disc 140. In addition, only a single tightening assembly 108 can be used to connect both the terminal rod 68 to the electrical connector 20 and also connect the wire strap 124 to ground in the surrounding shaft 148. Thus, the present connector assembly provides the advantages of reduced erosion and lower thermal stress on the electrode 48b in the ceramic disc 140.

A substrate support that uses the electrical connector 20 to connect a terminal 26 of an electrode 48 or resistance heater 64 is schematically illustrated in FIG. 5. Generally, the substrate support 20 comprises a ceramic disc 140 having a substrate receiving surface 22 exposed to the plasma in the chamber. The ceramic disc 140 is a unitary monolith structure composed of aluminum nitride or aluminum oxide. The ceramic disc 140 is generally planar and has a diameter or width sized to receive the substrate 62, for example, about 200 or about 300 mm. The ceramic disc 140 can also have lift pin holes (not shown) for the passage of lift pins which raise or lower a substrate 62 onto the ceramic disc 140.

The ceramic disc 140 has an embedded electrode 48b that functions as a gas energizer in conjunction with electrode 48a (wall of the chamber 42). For example, when RF energy is applied to the electrode 48a and the electrode 48b is grounded, the electrical energy capacitively couples through the process gas to form or sustain a plasma of the process gas. The electrode 48b can also serve as an electrostatic attraction member to electrostatically hold a substrate on the support. In one version, the electrode 48b comprises a metallic mesh embedded in the ceramic disc 140, which is made of a metal such as molybdenum. The electrode 48b brazed to a first end 70a of an electrode terminal 28 and the second end 70b of the terminal 28 is electrically connected to an electrode power supply 44 of an external power source 24 by the electrical connector 20. In one version, the electrode terminal 28 comprises a nickel-based alloy.

The ceramic disc 140 can also include a resistance heater 64 to heat the substrate 62 held on the support 20. The resistance heater 64 can be an electrical resistor wire that generates heat upon application of a voltage across the wire. The resistance heater 64 can also be connected to an external power source 24 that provides a DC voltage to power the resistance heater 64 through a pair of terminal rods and corresponding electrical connectors 20. For example, the resistance heater 64 can be a metal wire having a cylindrical cross-section that is coiled concentrically to form a spiral from the center to the edge of the ceramic disc 140. A suitable metal wire can be a molybdenum or nichrome wire.

The substrate support 20 also comprises a hollow shaft 148 to hold and position the ceramic disc 140 within the processing chamber. The hollow shaft 148 also provides a protective cover through which terminals 26, such as the electrode terminal 28 and the heater terminals 30a,b, are passed to reach the ceramic disc 140 from the external environment outside the chamber 42. In one version, the hollow shaft 148 is a hollow cylinder made from a ceramic, such as aluminum oxide, and is attached to the ceramic disc 140 by mechanical fasteners such as screws and bolts, or by a fabrication process such as sintering, hot pressing, and other methods.

The substrate support 20 can be used in substrate processing chambers 42 to deposit or etch material on substrates 64. For example, the chamber 42 can be a chemical vapor deposition (CVD) chamber, as illustrated in FIG. 5, to deposit material on the substrate by a chemical vapor deposition process. The chamber 42 can be a stand-alone chamber or part of a larger processing system that includes multiple chambers mounted on a platform. The exemplary chamber 42 has enclosure walls 54 enclosing a process zone 40 in which a substrate 62 is processed. The substrate support 20 holds the substrate 62 in the process zone 40, and the support hollow shaft 148 is attached to a lift motor 152 that drives the support 20 up and down within the chamber 42. In a lowered position, the support 20 aligns to a port 154 through which the substrate 62 is introduced to the chamber 42 and loaded onto the support 20. The substrate 62 can be loaded into the chamber 42 by a robot arm (not shown). The chamber 42 may also comprise an edge ring 156 to separate the portion of the chamber 42 below the substrate support 20 from the process zone 40 above the substrate 62.

A process gas is introduced into the chamber 42 from a process gas source 158, through a process gas valve 160 and process gas inlet 162, to feed a gas distributor 164 which distributes the process gas across the process zone 40. The gas distributor 164 can be a showerhead plate 166 with a plurality of holes 168 through which the process gas passes. A purge gas can also be introduced into the chamber from a purge gas inlet 170 fed by a purge gas valve 172 and a purge gas supply 174. Gas is exhausted from the chamber 42 through a gas outlet 180 which feeds through a exhaust valve 182 into a gas exhaust 184.

In the version shown, a gas energizer 190 which energizes the process gas in the chamber 42 with electrical power supplied by the electrode power supply 44 to the first and second electrodes 48*a*,*b*, where the first electrode 48*a* is formed by the gas distributor 164 made from an electrically conducting material for that purpose. In this version, the enclosing walls 54 and first electrode 48*b* in the substrate support 20 are grounded relative to the second electrode 48*b*. The electrode power supply 44 is capable of providing RF power of from about 100 watts to about 5000 watts to the electrodes 48*a*,*b*.

The process chamber 42 also comprises a resistance heater power supply 46 to deliver power to the resistance heater 64. In one version, the heater power supply 46 is capable of delivering from about 100 to about 4000 Watts of direct current to the resistance heater 64.

A controller 200 is used to control the chamber components 32 of the substrate processing chamber 42, including the heater power supply 46, electrode power supply 44, lift motor 152, process gas valve 160, purge gas valve 172, exhaust gas valve 182 and other components. A suitable controller 200 comprises a computer (not shown) having a central processing unit (CPU), such as a Pentium Processor commercially available from Intel Corporation, Santa Clara, Calif., that is coupled to a memory, peripheral computer components, and program code to provide instructions to the components 32 of the chamber 42. The controller 200 may further comprise a plurality of interface cards (also not shown) including, for example, analog and digital input and output boards, interface boards, and motor controller boards. The interface between a human operator and the controller 200 can be, for example, via a display and a light pen.

The substrate support 20 also be refurbished to extend its useful lifetime. The refurbishment process comprises releasing the tightening assembly 108 and withdrawing the electrical connector 20 from the electrode terminal 28 or heater terminals 30*a*,*b*. The electrical connector 20 and terminals 26 are cleaned with a cleaning solvent, such as alcohol or acetone. After cleaning, the cleaned electrical connector 20 and terminals 26, or replacement connector 20 or terminals 26 if the old connector 20 and terminal 26 shows signs of erosion or corrosion, is assembled. A tightening assembly 108 is then inserted to the strap holes 126 of the flexible wire strap 124 and the through holes 104*a*-*d* of the pincer arms 74*a*,*b* of the electrical connector 20. The tightening assembly 108 is then tightened to clamp the electrical connector 20 onto the terminal 16 and wire strap 124. The other end of the wire strap 124 is then connected to the metal casing 150 within the hollow shaft 148 to electrically ground the electrode terminal 28.

Although the present invention has been described in considerable detail with regard to the preferred versions thereof, other versions are possible. For example, the pincer arms 74*a*,*b* can have other configurations, such as a cylindrical shaped with a circular cross-section, or even a square or rectangular cross-section. The tightening assembly 108 can also be springy metal clip that clips the pincer arms 74*a*,*b* against one another, or the pincer arms 74*a*,*b* themselves can be spring biased against one another. Also, the ceramic disc 140 can comprise ceramic materials other than those specifically mentioned. Additionally, relative terms such as bottom, top, up, and down, are in some instances interchangeable and have been used merely to describe embodiments of the invention. Therefore, the appended claims should not be limited to the preferred versions and relative terms contained herein.

What is claimed is:

1. A substrate support for a substrate processing chamber, the support comprising:
    (a) a ceramic disc having a surface to receive a substrate;
    (b) an electrode in the ceramic disc;
    (c) an electrode terminal having a first end electrically coupled to the electrode in the ceramic disc and a second end extending out of the ceramic disc; and
    (d) an electrical connector for connecting an external power source to the electrode terminal, the electrical connector comprising:
        (i) first and second opposing pincer arms;
        (ii) a groove sized to fit around the second end of the electrode terminal, the groove having a longitudinal axis; and
        (iii) first and second sets of through holes for receiving a tightening assembly capable of tightening the pincer arms about the electrode terminal, the first set of through holes being in the first pincher arm and the second set of through holes being in the second pincher arm, and the first and second set of through holes being aligned along an axis that is substantially parallel to the longitudinal axis of the groove.

2. A support according to claim 1 wherein the through holes comprise screw threads and the tightening assembly comprises screws sized to turn into the screw threads of the through holes.

3. A support according to claim 1 wherein the tightening assembly comprises nuts and bolts.

4. A support according to claim 1 comprising a recessed portion for receiving the through holes and tightening assembly.

5. A support according to claim 1 wherein the groove is in one of the pincer arms.

6. A support according to claim 1 wherein the pincer arms comprise first and second plates that are joined at one end by a circular coupling span.

7. A support according to claim 6 wherein the first plate has uniform thickness and the second plate is tapered.

8. A support according to claim 7 wherein the second plate is tapered by an amount such that the second plate bends toward the first plate when the tightening assembly is tightened about the electrical terminal.

9. A support according to claim 1 wherein the ceramic disc comprises aluminum nitride.

10. A support according to claim 1 further comprising:
 (e) a resistance heater in the ceramic disc;
 (f) a pair of heater terminals that each comprise a first end connected to the resistance heater and a second end extending out of the ceramic disc; and
 (g) a pair of second electrical connectors for connecting an external power source to the resistance heater, the second electrical connectors each comprising a pair of opposing pincer arms, a groove sized to fit around a second end of a heater terminal, and a pair of through holes for receiving a tightening assembly capable of tightening the pincer arms about the heater terminal.

11. A substrate processing apparatus comprising:
 (1) a process chamber comprising enclosing walls that include another electrode, the substrate support of claim 1, a gas distributor, and a gas exhaust;
 (2) an external power source to provide electrical power to the electrodes; and
 (3) a controller comprising program code to provide instructions to the external power source to provide a selected power level to the electrodes.

12. A method of using the electrical connector of claim 1 comprising:
 (a) sliding the electrical connector onto the electrode terminal so that the electrode terminal rests in the groove of the electrical connector;
 (b) inserting a tightening assembly into the through holes of the electrical connector; and
 (c) tightening the tightening assembly so that the opposing pincer arms of the electrical connector squeeze the electrical terminal.

13. A method of refurbishing the substrate support of claim 1 the method comprising:
 (a) releasing the tightening assembly:
 (b) withdrawing the electrical connector from the electrode terminal;
 (c) cleaning or replacing at least one of the electrode terminal and electrical connector;
 (d) sliding an electrical connector onto an electrode terminal so that the electrode terminal rests in the groove of the electrical connector;
 (e) inserting a tightening assembly into the through holes of the electrical connector; and
 (f) tightening the tightening assembly so that the pincer arms are squeezed onto the electrode terminal.

14. A method according to claim 13 comprising cleaning at least one of the electrode terminal and electrical connector by rubbing the electrode terminal and electrical connector with a cleaning solvent.

15. A substrate support for a substrate processing chamber, the chamber comprising an external power source, the support comprising:
 (a) a ceramic disc having:
  (i) a surface to receive a substrate;
  (ii) a resistance heater in the ceramic disc;
  (iii) an electrode in the ceramic disc;
 (b) an electrode terminal having a first end electrically coupled to the electrode in the ceramic disc and a second end extending out of the ceramic disc; and
 (c) an electrical connector for connecting the external power source to the electrode terminal, the electrical connector comprising a pair of opposing pincer arms, a groove sized to fit around the second end of the electrode terminal, and a pair of through holes for receiving a tightening assembly capable of tightening the pincer arms about the electrode terminal.

16. A substrate support according to claim 15 further comprising:
 (d) a pair of heater terminals, each heater terminal comprising a first end connected to the resistance heater and a second end extending out of the ceramic disc; and
 (e) a pair of second electrical connectors for connecting an external power source to the resistance heater, the second electrical connectors each comprising a pair of opposing pincer arms, a groove sized to fit around a second end of a heater terminal, and a pair of through holes for receiving a tightening assembly capable of tightening the pincer arms about the heater terminal.

17. A substrate support according to claim 15 comprising a nickel alloy covering the second end of the electrode terminal, the internal surfaces of the pincer arms, and the groove.

18. A support according to claim 15 wherein the pincer arms comprise first and second plates that are joined at one end by a circular coupling span.

19. A support according to claim 18 wherein the first plate has uniform thickness and the second plate is tapered.

20. A substrate processing apparatus comprising:
 (1) a process chamber comprising enclosing walls that include another electrode, the substrate support of claim 15, a gas distributor, and a gas exhaust;
 (2) an external power source to provide electrical power to the electrodes; and
 (3) a controller comprising program code to provide instructions to the external power source to provide a selected power level to the electrodes.

21. A method of using the electrical connector of claim 15 comprising:
 (a) sliding the electrical connector onto the electrode terminal so that the electrode terminal rests in the groove of the electrical connector;
 (b) inserting a tightening assembly into the through holes of the electrical connector; and
 (c) tightening the tightening assembly so that the opposing pincer arms of the electrical connector squeeze the electrical terminal.

22. A method of refurbishing the substrate support of claim 15, the method comprising:
 (a) releasing the tightening assembly;
 (b) withdrawing the electrical connector from the electrode terminal;
 (c) cleaning or replacing at least one of the electrode terminal and electrical connector (d) sliding an electrical connector onto an electrode terminal so that the electrode terminal rests in the groove of the electrical connector;
(e) inserting a tightening assembly into the through holes of the electrical connector; and
(f) tightening the tightening assembly so that the pincer arms are squeezed onto the electrode terminal.

23. A method according to claim 22 comprising cleaning at least one of the electrode terminal and electrical connector by rubbing the electrode terminal and electrical connector with a cleaning solvent.

\* \* \* \* \*